United States Patent [19]

Borg et al.

[11] Patent Number: 4,692,903

[45] Date of Patent: Sep. 8, 1987

[54] MEMORY LOSS PROTECTION CIRCUIT

[75] Inventors: Arthur N. Borg, Lake Forest; Giora Bar-Hai, River Forest, both of Ill.

[73] Assignee: Zenith Electronics Corporation, Glenview, Ill.

[21] Appl. No.: 755,509

[22] Filed: Jul. 15, 1985

[51] Int. Cl.$^4$ .............................................. G11C 11/34
[52] U.S. Cl. ..................................... 365/226; 365/229
[58] Field of Search ................ 365/226, 227, 229, 228

[56] References Cited

U.S. PATENT DOCUMENTS

| | | | |
|---|---|---|---|
| 4,388,706 | 6/1983 | Butler | 365/226 |
| 4,485,456 | 11/1984 | Toyoda | 364/900 |
| 4,493,000 | 1/1985 | Edwards | 361/92 |
| 4,587,640 | 5/1986 | Saitoh | 365/229 |

FOREIGN PATENT DOCUMENTS 55-39983  3/1980  Japan ..................................... 365/226

OTHER PUBLICATIONS

Magnavox Service Manual, No. 7362A, Issued Mar. 1979.

*Primary Examiner*—Joseph A. Popek

[57] ABSTRACT

In a data processing system, an input line voltage is provided to a series voltage regulator which, in turn, provides well defined DC voltages to various logic devices including a system controller, such as a microprocessor. System controller operation is degraded by variations in the DC voltage provided thereto, generally resulting in the erroneous writing of data into a nonvolatile memory in the data processing system when the DC voltage provided to the system controller drops below a given voltage level caused by, for example, variations in the input line voltage. The input line voltage to the data processing system is monitored across the series voltage regulator for deselecting/write disabling the memory in the event the input voltage drops below a predetermined level, such as due to power transients, to prevent loss of data stored in the memory. By monitoring the system input voltage across the series voltage regulator, the ratio of input voltage change to the input voltage level is increased to facilitate detection of low voltage states. By thus increasing the relative value of an input voltage drop required for deselection/write disabling of the nonvolatile memory, low voltage detection circuitry design and operating parameters as well as component ratings may be relaxed.

7 Claims, 4 Drawing Figures

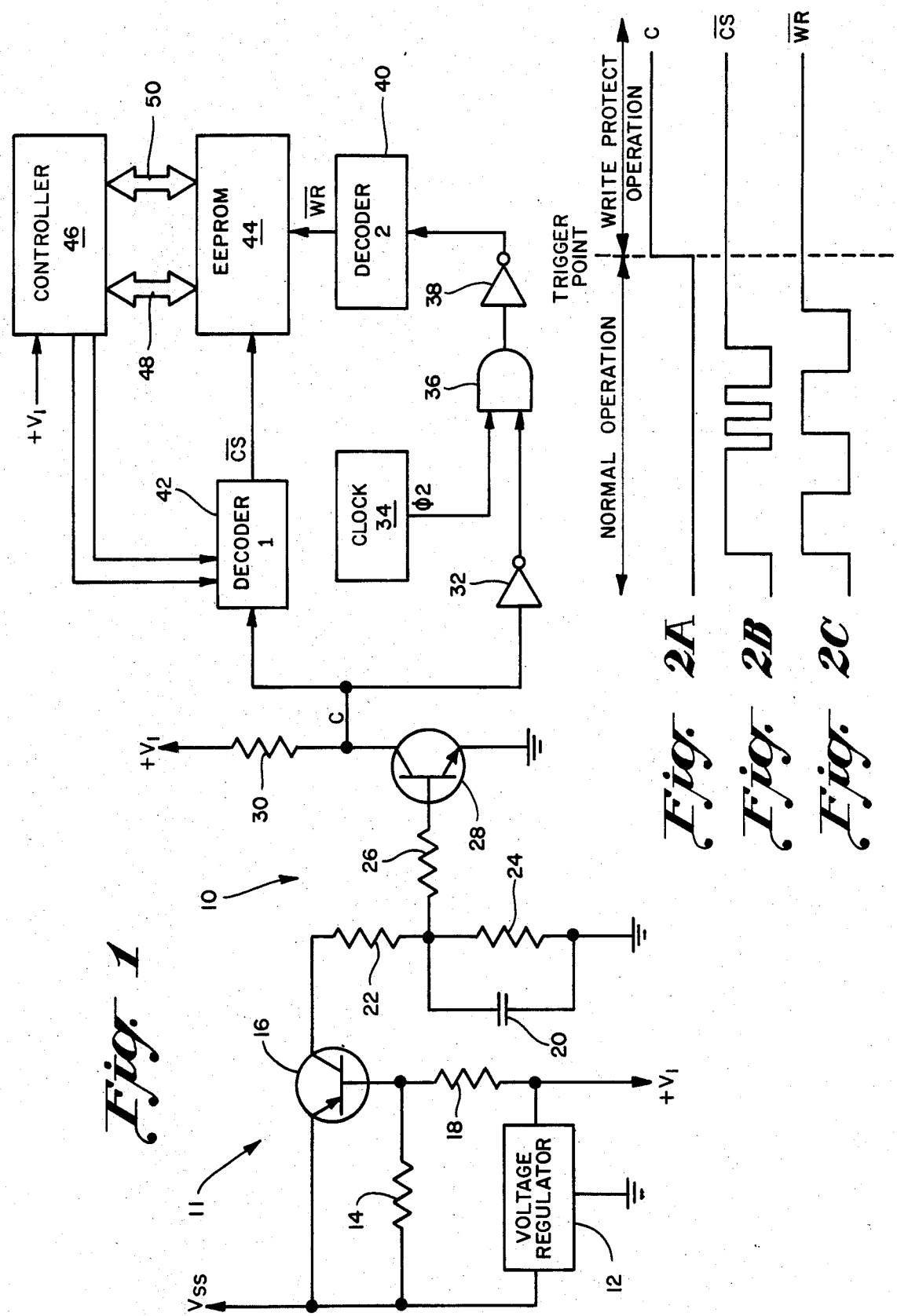

MEMORY LOSS PROTECTION CIRCUIT

BACKGROUND OF THE INVENTION

This invention relates generally to data processing systems and is particularly directed to the prevention of loss of data stored in a nonvolatile memory in a data processing system arising from variations in an input voltage provided thereto.

Programmable memories are increasingly being utilized for various applications ranging from the timed control of a device by means of user initiated inputs to the temporary storage and processing of data in a computer terminal. These programmable memories may assume various forms such as random access memory (RAM) or an electrically alterable read only memory (EEROM or EAROM) depending upon the specific application in which the integrated circuit (IC) memory is utilized. In the RAM type of programmable memory, the data stored therein is lost when power is removed from the memory, this giving rise to the term "volatile" in describing this type of memory. The EEROM type of memory is nonvolatile and thus maintains the data stored therein following the removal of power therefrom. However, data is frequently erased or over-written in these nonvolatile memories as a result of input voltage variations giving rise to the generation of erroneous write commands by a system controller which are provided to the nonvolatile memory.

Various approaches have been undertaken in the prior art to reduce or eliminate the possibility of loss of data in a nonvolatile memory arising from input voltage transients. Some approaches make use of a second nonvolatile memory in the system which is coupled to the first nonvolatile memory and reads the contents therefrom in response to a reduction in the input voltage below a designated voltage level. The second nonvolatile memory is not responsive to a write command from the system controller and is thus not subject to erroneous over-writing of data by the controller into the nonvolatile memory. The requirement for a second nonvolatile memory in this approach precludes its use in those system where low cost and reduced complexity are primary considerations.

Other approaches have used various input voltage detection circuit arrangements for disabling the memory when the input voltage drops below a predetermined threshold voltage. One example of this approach can be found in U.S. Pat. No. 4,493,000 to Edwards wherein a Zener diode responsive to the power supply voltage controls the voltage level at which a transistor turns on, with the transistor enabling a logic device in which data is stored or processed. The Zener diode in this approach is not only expensive but also exhibits a characteristic wide operating tolerance at the low voltages used in a data processing system. Another approach is disclosed in U.S. Pat. No. 4,485,456 to Toyoda wherein various signals within a data processing system are monitored in generating, when the main power voltage drops lower than a reference voltage, an operation/halt signal which, in turn, results in the providing of a write inhibit signal by setting a D-type latch at the timing of the transition of the next instruction fetch (NIF) signal to the active mode and providing the write inhibit signal to a read/write memory. Another approach maintains the output-enable pin of the nonvolatile memory inactive until the input power reaches a selected voltage level. These approaches require the processing of various digital signals in the data processing system and thus involve various logic gates and signal timing considerations.

Still another approach to a write protect circuit in a data processing system having a nonvolatile memory monitors the voltage at the input to a voltage regulator which provides various DC outputs for energizing system logic circuitry. When the voltage at the input of the voltage regulator drops below a predetermined level, the nonvolatile memory is automatically deselected. An example of this approach can be found in Magnavox Service Manual No. 7362A, issued March, 1979. This approach suffers from the limitation that the reduction in input voltage which must be sensed in order to inactivate the memory device to prevent the erroneous writing of data therein is small in comparison with the operating voltage thus requiring a detection circuit having a relatively high voltage discrimination capability and comprised of components having high accuracy, e.g., 2% tolerance.

The present invention represents an improvement over prior art memory loss protection circuits by providing for the comparison of an input voltage drop which initiates deselection of nonvolatile memory device with a minimum operating voltage. By thus comparing a reduction in input voltage to a low operating voltage level, the voltage discrimination characteristics of the memory loss protection circuit may be relaxed permitting the use of reduced component ratings and less demanding circuit design and operating parameters.

OBJECTS OF THE INVENTION

Accordingly, it is an object of the present invention to provide improved memory loss protection for a nonvolatile memory in a data processing system.

It is another object of the present invention to avoid the loss of data stored in a nonvolatile memory arising from transients in an input voltage.

Yet another object of the present invention is to provide reliable and inexpensive circuit means for automatically deselecting a nonvolatile memory integrated circuit in response to a reduction in the input voltage provided thereto in preventing the loss of data stored in the memory.

A further object of the present invention is to provide a memory deselect circuit for a data processing system which is highly responsive to line voltage transients to prevent memory alteration for even slight line voltage variations of extremely short duration.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings in which:

FIG. 1 is a combined schematic and block diagram of a memory loss protection circuit in accordance with the present invention; and FIGS. 2A, 2B and 2C illustrate the timing of various signals within the memory loss protection circuit of FIG. 1.

DETAILED DESCRIPTION OF THE PREFERRED EMBODIMENT

Referring to FIG. 1, there is shown in simplified schematic and block diagram form a memory loss protection circuit 10 for use in a data processing system 11 in accordance with the present invention. For simplicity, only those portions of the data processing system 11 which interface with the memory loss protection circuit 10 are discussed herein, it being understood that a conventional data processing system includes additional components not shown in the figure or described herein.

A rectified line voltage $V_{SS}$ is provided from conventional rectification circuitry (not shown) to a voltage regulator 12. The voltage regulator 12 provides a well regulated DC output voltage $V_1$ to various logic circuitry within the data processing system 11 including a system controller 46, which in one embodiment of the invention is a 6502 microprocessor. The voltage regulator in a preferred embodiment is a 7805 voltage regulator to which a 9 VDC input is provided and which, in turn, provides a well regulated 5 VDC output voltage for energizing various components within the system.

Also coupled to $V_{SS}$ and responsive to the rectified input voltage in a PNP transistor 16. A voltage divider network comprised of resistors 14 and 18 is coupled across the voltage regulator 12 and across the base-emitter junction of the PNP transistor 16 and establishes the turn-on voltage of the transistor as a function of the voltage across the voltage regulator 12. Because of the rapid turn-on characteristics of the PNP transistor 16, e.g., the typical transistor is capable of going from nonconducting to full conducting over a range of 150 millivolts, the turn-on and turn-off of PNP transistor 16 provides an accurate indication of the voltage across the linear voltage regulator 12. For example, when the voltage across the voltage regulator 12 exceeds a predetermined level as established by resistors 14 and 18, PNP transistor 16 will be rapidly turned on to the full conducting state. PNP transistor 16 will similarly be rapidly rendered nonconducting when the voltage across the voltage regulator 12 goes below this predetermined voltage level. In a preferred embodiment, PNP transistor 16 is turned on to the full conducting state when the voltage across the voltage regulator 12 exceeds 2.5 VDC and is rendered nonconductive when the voltage across the voltage regulator drops below 2.0 VDC.

With PNP transistor 16 conducting, a current is provided to the base of NPN transistor 28 via a voltage divider network comprised of resistors 22 and 24. Resistor 26 coupled to the base of NPN transistor 28 limits the current provided thereto. With the $V_1$ output voltage from the series voltage regulator 12 provided via resistor 30 across NPN transistor 28, when PNP transistor 16 conducts, NPN transistor 28 will similarly be rendered conductive. Similarly, when PNP transistor 16 is rendered nonconductive in response to a decrease in the voltage applied across the voltage regulator 12 below a predetermined threshold level, NPN transistor 28 will be rendered nonconductive. Capacitor 20 coupled to the base of NPN transistor 28 and across grounded resistor 24 is charged by current from PNP transistor 16 for more rapidly rendering NPN transistor 28 nonconductive with a decrease in current provided to the base thereof from the collector of PNP transistor 16 in response to a reduction in the input voltage.

With NPN transistor 28 conductive and its emitter connected to neutral ground potential, the voltage at its collector will be low. With a low C input provided to a first decoder 42 (together with a plurality of additional input address signals from controller 46), a pulsating Chip Select ($\overline{CS}$) signal will be output from the first decoder to a nonvolatile memory 44 such as an electrically erasable programmable read only memory (EEPROM). The low state of the $\overline{CS}$ input to the nonvolatile memory 44 activates the nonvolatile memory to permit data to be either written into or read from the nonvolatile memory. Similarly, with NPN transistor 28 conducting and its collector held low, the output of inverter 32 coupled thereto will be high. The output of inverter 32 is provided to one input of an AND gate 36, while another input $\phi 2$ is provided to another input of the AND gate from a system clock 34. The $\phi 2$ timing signal is present at all times during normal operation of the system in which the memory loss protection circuit 10 is utilized. With the clock signal $\phi 2$ and a high output from inverter 32 provided to AND gate 36, the clock signal $\phi 2$ wil be provided to an inverter 38 which, in turn, will provide a $\overline{\phi 2}$ clock signal to a second decoder 40 which couples the $\phi 2$ clock signal as a write enable signal ($\overline{WR}$) to a second input of memory 44. The low state of the $\overline{WR}$ signal enables data to be written into the nonvolatile memory 44. Thus, when both the $\overline{CS}$ and $\overline{WR}$ signals are in their low states, data may be written into the nonvolatile memory. If either of these signals should transition to a HIGH state, alteration of the data stored within the nonvolatile memory 44 will be prevented and the stored data will be preserved therein.

Data is written into or read from the nonvolatile memory 44 from the system controller, or microprocessor, 46. The system controller 46 is energized by the $V_1$ output voltage of the voltage regulator 12 and is coupled to the nonvolatile memory 44 via bi-directional address and data buses 48, 50. The system controller 46 is subject to unreliable operation wherein data may be erroneously written into the nonvolatile memory 44 when the $V_1$ input voltage provided thereto drops below a given threshold voltage level. It is this occurrence which the memory loss protection circuit 10 of the present invention is intended to prevent.

If the voltage across the voltage regulator 12 drops below a predetermined level, as indicated above, PNP transistor 16 and NPN transistor 28 will be rendered nonconductive. With NPN transistor 28 nonconductive, its collector will be maintained approximately at $V_1$ by means of resistor 30. A high input to the first decoder 42 will result in a continuously high $\overline{CS}$ output therefrom and the deselection of the nonvolatile memory 44 so as to prevent the writing of data into or the reading of data from the nonvolatile memory. A high input from the collector of NPN transistor 28 to inverter 32 will similarly result in a low signal to one of the input pins of AND gate 36. AND gate 36 will, in turn, provide a $\phi 2$ input to inverter 38 resulting in a $\phi 2$ input being provided to the second decoder 40. A $\phi 2$ input to the second decoder 40 results in a continuously high $\overline{WR}$ input to the volatile memory 44 so as to preclude the writing of data therein. With both the $\overline{CS}$ and $\overline{WR}$ inputs to the nonvolatile memory 44 continuously high in response to a low voltage applied across the voltage regulator 12, the memory loss protection circuit 10 of the present invention provides two levels of protection against an alteration of data stored in the nonvolatile memory.

Referring to FIGS. 2A, 2B and 2C, there is shown the timing of various signals within the memory loss protection circuit 10 of the present invention. In FIG. 2A is shown the output C of the NPN transistor 28 at its collector which is provided to the inverter 32 and to the first decoder 42. During normal operation, the C output of the NPN transistor 28 is LOW. Also, during normal operation the respective outputs of the first and second decoders 42, 40 are respectively shown in FIGS. 2B and 2C as a series of pulses $\overline{CS}$ and $\overline{WR}$ which are provided to the nonvolatile memory 44. The pulsed $\overline{CS}$ and $\overline{WR}$ inputs provided to the nonvolatile memory permit data to be periodically written therein. Following transition of the C output of the NPN transistor 28 at the "trigger point" as shown in FIG. 2A to a low state, the $\overline{CS}$ and $\overline{WR}$ outputs of the first and second decoders 42, 40 are continuously maintained in a HIGH state to provide two levels of protection against the erroneous writing of data into the nonvolatile memory 44. It is in this manner that the memory loss protection circuit 10 of the present invention prevents the overwriting or alteration of data in the nonvolatile memory 44 as a result of low power transients in the input line to the system in which the nonvolatile memory is utilized.

There has thus been shown a memory loss protection circuit responsive to transients in the input line voltage for preventing the erroneous writing of data into a nonvolatile memory as a result of input line voltage variations. The memory loss protection circuit of the present invention is responsive to small variations in input line voltage for rapidly deselecting and disabling the write enable input of the nonvolatile memory in preventing the alteration or overwriting of data within the nonvolatile memory.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. For use in a data processing system energized by a line voltage subject to transients, wherein data is written into a nonvolatile memory for storage therein and is read from the nonvolatile memory under the control of a system controller coupled to the nonvolatile memory, a memory protection circuit for preventing the alteration of data stored in the nonvolatile memory arising from line voltage transients comprising:

voltage regulation means coupled to the system controller and responsive to the line voltage for providing a regulated DC voltage to the system controller;

voltage level sensing means coupled across said voltage regulation means for detecting a decrease in the line voltage below a predetermined threshold level and for outputting a control signal in response thereto; and decoding means coupled to the nonvolatile memory and to said voltage level sensing means and responsive to said control signal for deselecting and write disabling the nonvolatile memory when the voltage across said voltage regulation means drops below said predetermined threshold level in preventing the writing of data into the nonvolatile memory.

2. The memory protection circuit of claim 1 wherein said voltage level sensing means includes a transistor, wherein said transistor is rendered nonconductive when the voltage across said regulation means is less than said predetermined threshold level for providing said control signal to said decoding means.

3. The memory protection circuit of claim 2 wherein said voltage level sensing means further includes a voltage divider network coupled across said transistor and said voltage regulation means for dividing down the voltage across said voltage regulation means in increasing the ratio of said decrease in the line voltage below a predetermined threshold level and the line voltage.

4. The memory protection circuit of claim 1 wherein said decoding means includes first and second decoders responsive to said control signal for respectively deselecting and write disabling the nonvolatile memory when the voltage across said regulation means drops below said predetermined threshold level.

5. The memory protection circuit of claim 4 wherein the nonvolatile memory comprises an electrically erasable programmable read only memory.

6. The memory protection circuit of claim 5 wherein the system controller comprises a microprocessor.

7. For use in a data processing system energized by a line voltage subject to transients, wherein data is written into a nonvolatile memory for storage therein and is read from the nonvolatile memory under the control of a system controller coupled to the nonvolatile memory, a memory protection circuit for preventing the alteration of data stored in the nonvolatile memory arising from line voltage transients comprising:

voltage regulation means coupled to the system controller and responsive to the line voltage for providing a regulated DC voltage to the system controller;

voltage level sensing means coupled across said voltage regulation means for detecting a decrease in the line voltage below a predetermined threshold level and for outputting a control signal in response thereto, said voltage level sensing means including a voltage divider network coupled across said voltage regulation means for dividing down the voltage across said voltage regulation means in increasing the ratio of the line voltage decrease to the line voltage; and decoding means coupled to the nonvolatile memory and to said voltage level sensing means and including first and second decoders responsive to said control signal for respectively deselecting and write disabling the nonvolatile memory when the voltage across said voltage regulation means drops below said predetermined threshold level in preventing the alteration of data stored in the nonvolatile memory.

* * * * *